(12) United States Patent
Ishikawa et al.

(10) Patent No.: US 7,161,807 B2
(45) Date of Patent: Jan. 9, 2007

(54) HEAT SPREADER MODULE

(75) Inventors: Takahiro Ishikawa, Toyoake (JP);
Masayuki Shinkai, Ama-gun (JP);
Makoto Miyahara, Nagoya (JP);
Shuhei Ishikawa, Handa (JP); Nobuaki Nakayama, Obu (JP); Kazuyoshi Inoue, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 210 days.

(21) Appl. No.: 10/783,892

(22) Filed: Feb. 20, 2004

(65) Prior Publication Data

US 2004/0207987 A1   Oct. 21, 2004

(30) Foreign Application Priority Data

Feb. 21, 2003   (JP) .............................. 2003-044993

(51) Int. Cl.
*H05K 7/20* (2006.01)
*F28F 7/00* (2006.01)

(52) U.S. Cl. ...................... 361/708; 165/185; 438/107; 361/715

(58) Field of Classification Search ................ 361/708
See application file for complete search history.

(56) References Cited

U.S. PATENT DOCUMENTS

| 5,336,342 | A | * | 8/1994 | Ashok .......................... 148/432 |
| 5,863,493 | A | * | 1/1999 | Achari et al. ................ 420/557 |
| 5,981,085 | A |   | 11/1999 | Ninomiya et al. |
| 6,069,023 | A | * | 5/2000 | Bernier et al. ............... 438/107 |
| 6,110,577 | A | * | 8/2000 | Ishikawa et al. .......... 428/307.7 |
| 6,651,736 | B1 | * | 11/2003 | Chiu et al. .................... 165/185 |
| 2001/0038140 | A1 | | 11/2001 | Karker et al. |
| 2002/0124955 | A1 | | 9/2002 | Tung et al. |
| 2003/0003287 | A1 | * | 1/2003 | Tobita ..................... 428/297.4 |

FOREIGN PATENT DOCUMENTS

| EP | 0 661 748 A1 | 7/1995 |
| EP | 1 160 860 A1 | 12/2001 |
| EP | 1 363 325 A1 | 11/2003 |
| JP | 2-243331 A1 | 9/1990 |
| JP | 2001-339022 A1 | 12/2001 |
| JP | 2002-043482 A1 | 2/2002 |

OTHER PUBLICATIONS

Properties and Selection: Nonferrous Alloys and Special-Purpose Materials, vol. 2, Metals Handbook, 10th edition, ASM International, (1992), Online edition. Table 1, Table 2, and other relevant pages.*

* cited by examiner

*Primary Examiner*—Gregory D Thompson
(74) *Attorney, Agent, or Firm*—Burr & Brown

(57) ABSTRACT

A heat spreader module includes a base, a heat spreader member arranged on the base, a thermal conductive layer arranged on the heat spreader member, a first joining member interposed between the base and the heat spreader member, and a second joining member interposed between the heat spreader member and the thermal conductive layer. The base comprises a copper alloy which has a proof stress of not less than 45 MPa and a coefficient of thermal conductivity of not less than 270 W/mK after performing a heat treatment between 600° and 900° C. for 10 minutes.

12 Claims, 5 Drawing Sheets

FIG. 4

| | t1 (mm) | t2 (mm) | t3 (mm) | t4 (mm) | MATERIAL OF BASE | t5 (mm) | t6 (mm) | t5/t6 | λb (W/mK) | YS (MPa) | λm (W/mK) | DEFORMATION RATIO (%) |
|---|---|---|---|---|---|---|---|---|---|---|---|---|
| COMPARATIVE EXAMPLE 1 | 0.3 | 0.3 | 1 | 3 | PURE COPPER | 1 | 5.6 | 0.179 | 395 | 14 | 302 | 100 |
| COMPARATIVE EXAMPLE 2 | 0.3 | 0.3 | 1 | 3 | PURE COPPER | 2 | 6.6 | 0.303 | 395 | 14 | 312 | 60 |
| COMPARATIVE EXAMPLE 3 | 0.3 | 0.3 | 1 | 3 | Cu-2.2Sn | 2 | 6.6 | 0.303 | 225 | 165 | 251 | 0 |
| EXAMPLE 1 | 0.3 | 0.3 | 1 | 3 | Cu-0.8Cr | 0.5 | 5.1 | 0.098 | 357 | 74 | 286 | 0 |
| EXAMPLE 2 | 0.3 | 0.3 | 1 | 3 | Cu-0.8Cr | 1 | 5.6 | 0.179 | 357 | 74 | 298 | 0 |
| EXAMPLE 3 | 0.3 | 0.3 | 1 | 3 | Cu-0.8Cr | 2 | 6.6 | 0.303 | 357 | 74 | 305 | 0 |
| EXAMPLE 4 | 0.3 | 0.3 | 1 | 3 | Cu-0.8Cr | 3 | 7.6 | 0.395 | 357 | 74 | 308 | 0 |
| EXAMPLE 5 | 0.3 | 0.3 | 1 | 3 | Cu-1Cr-0.2Zr | 1 | 5.6 | 0.179 | 312 | 82 | 282 | 0 |
| EXAMPLE 6 | 0.3 | 0.3 | 1 | 3 | Cu-1Cr-0.2Zr | 2 | 6.6 | 0.303 | 312 | 82 | 288 | 0 |
| EXAMPLE 7 | 0.3 | 0.3 | 1 | 3 | Cu-0.25Zr | 1 | 5.6 | 0.179 | 372 | 65 | 292 | 0 |
| EXAMPLE 8 | 0.3 | 0.3 | 1 | 3 | Cu-0.25Zr | 2 | 6.6 | 0.303 | 372 | 65 | 308 | 0 |
| EXAMPLE 9 | 0.3 | 0.3 | 1 | 3 | Cu-0.7Ag | 2 | 6.6 | 0.303 | 390 | 47 | 311 | 20 |
| EXAMPLE 10 | 0.3 | 0.3 | 1 | 3 | Cu-2.3Fe-0.12Zn-0.03P | 2 | 6.6 | 0.303 | 305 | 87 | 285 | 0 |

HEAT SPREADER MODULE

This application claims the benefit of Japanese Application 2003-044993, filed Feb. 21, 2003, the entirety of which is incorporated herein by reference.

BACKGROUND OF THE INVENTION

1. Field of the Invention

The present invention relates to a heat spreader module which is used to cool, for example, an IC chip of a semiconductor or the like.

2. Description of the Related Art

In general, a heat spreader module, which is used as a member for effectively dissipating the heat generated by a semiconductor device such as IGBT (Insulated Gate Bipolar Transistor), is provided with a base for joining a heat spreader member to a heat sink which serves as a heat-releasing member, in addition to a joined unit of a circuit, an insulating substrate, and the heat spreader member (heat-diffusing layer).

Conventionally, the base is composed of copper. When the joined unit is joined to the base, the joining is performed by using a solder layer (melting point=about 250° C.) in many cases. In this procedure, the situation is to the extent that the base is exposed to the joining temperature for the solder layer for a short period of time. It has been unnecessary to consider the softening by annealing in such a degree that the strength is lost.

However, there have been factors to raise the production cost which causes a high price, because of the large heat resistance brought about by the solder layer and the route to pass through the two steps, i.e., the step of brazing and soldering the circuit and the insulating substrate and the step of joining the joined unit and the base.

In view of the above, the present inventors have previously disclosed, in Japanese Laid-Open Patent Publication No. 2002-43482, a technique in which any joining layer, which causes the heat resistance, is not allowed to remain by joining a circuit, an insulating substrate, and a base by using a hard solder material while applying a pressure, wherein the joining is performed in one step. According to this technique, it is possible to inexpensively obtain a heat spreader module which has a high coefficient of thermal conductivity.

However, in the technique in which the joining is completed in one step as described above, the base is heated up to the melting point of the hard solder material. Therefore, it is feared that the base may be softened. Further, it is feared that the base may be deformed with ease during the handing in the production process.

SUMMARY OF THE INVENTION

The present invention has been made taking the problems as described above into consideration, an object of which is to provide a heat spreader module which makes it possible to suppress a base from deformation even when a hard solder material is used as a joining material and which does not lower the coefficient of thermal conductivity.

According to the present invention, there is provided a heat spreader module comprising at least a heat spreader member and an insulating substrate which are joined on a base; wherein the base includes a copper alloy which has a proof stress of not less than 45 MPa and a coefficient of thermal conductivity of not less than 270 W/mK when subjected to a heat treatment between 600° and 900° C. for 10 minutes (e.g., at 830° C. for 10 minutes).

At first, it is assumed that the heat spreader module is completed by means of one-time joining by using hard solder materials as a joining material for the base and the heat spreader member and as a joining material for the heat spreader member and the insulating substrate. On this assumption, the hard solder material is generally a brazing material having a melting temperature of not less than 450° C. Therefore, when the pure copper is used for the base, the pure copper is softened such that the strength is not more than 250 MPa and the proof stress is not more than 30 MPa, due to the heat history brought about by the joining. If the proof stress value is extremely lowered as described above, then the shape deformation tends to be caused even in the routine handling such as the attachment of the heat spreader module to a heat sink member by using a means such as the fastening with screws, and any inconvenience sometimes arises when the heat spreader module is used.

However, the present invention uses, as the base, the copper alloy which has the proof stress of not less than 45 MPa and the coefficient of thermal conductivity of not less than 270 W/mK after performing the heat treatment between 600° and 900° C. for 10 minutes. Therefore, even when the hard solder material is used as the joining material, the handling is not inconvenient unlike the heat spreader module comprising the base formed of pure copper in which the base is extremely softened.

That is, in the present invention, even when the joining method, which makes it possible to effectively reduce the production cost to be inexpensive, is used, the base is not deformed, for example, during the handling to be performed thereafter. Further, the present invention scarcely undergoes the decrease in coefficient of thermal conductivity of the heat spreader module which would be otherwise caused as a harmful influence in order to secure the proof stress value.

In other words, it is possible to maintain the strength of the base while the coefficient of thermal conductivity required for the heat spreader module is scarcely lowered. It is possible to reduce the production cost of the heat spreader module, realize the easy handling, and improve the reliability.

In relation to the heat spreader module constructed as described above, it is preferable that the copper alloy of the base is any one of:

(a) a copper alloy comprising 0.1 to 1.5 mass % Cr and the balance being Cu;

(b) a copper alloy comprising 0.1 to 0.5 mass % Zr and the balance being Cu;

(c) a copper alloy comprising 0.05 to 0.3 mass % Zr, 0.3 to 1.2 mass % Cr, and the balance being Cu;

(d) a copper alloy comprising 0.01 to 1.5 mass % Ag and the balance being Cu;

(e) a copper alloy comprising 1.4 to 3.0 mass % Fe, 0.05 to 0.2 mass % Zn, 0.01 to 0.1 mass % P, and the balance being Cu; and (f) alumina-dispersed copper (e.g., copper or copper alloy having alumina particles dispersed in it).

On the other hand, the heat spreader member may comprise a composite material including a C base material impregnated with one of Cu and a Cu alloy, or a composite material comprising an SiC base material impregnated with one of Cu and a Cu alloy. Further, the heat spreader member may comprise a composite material including carbon and one of copper and a copper alloy, or a composite material comprising SiC and one of copper and a copper alloy.

The insulating substrate may comprise AlN or $Si_3N_4$. Further, at least the base, the heat spreader member, and the insulating substrate may be joined with a hard solder material having a melting point of not less than 600° C.

It is preferable that the base has a thickness of not less than 0.5 mm, and the thickness is not more than 40% of an entire thickness of the heat spreader module.

An IC chip may be carried on the insulating substrate with an electrode interposed between the IC chip and the insulating substrate. Further, a heat-releasing member may be joined under the heat spreader member.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 4 shows a table illustrating results of an exemplary experiment to measure the proof stress of the base and the coefficient of thermal conductivity of the heat spreader module joined under a predetermined joining condition in relation to Comparative Examples 1 to 3 and Examples 1 to 10;

DESCRIPTION OF THE PREFERRED EMBODIMENTS

Illustrative embodiments of the heat spreader module according to the present invention will be explained below with reference to FIGS. 1 to 5.

Figure 1:
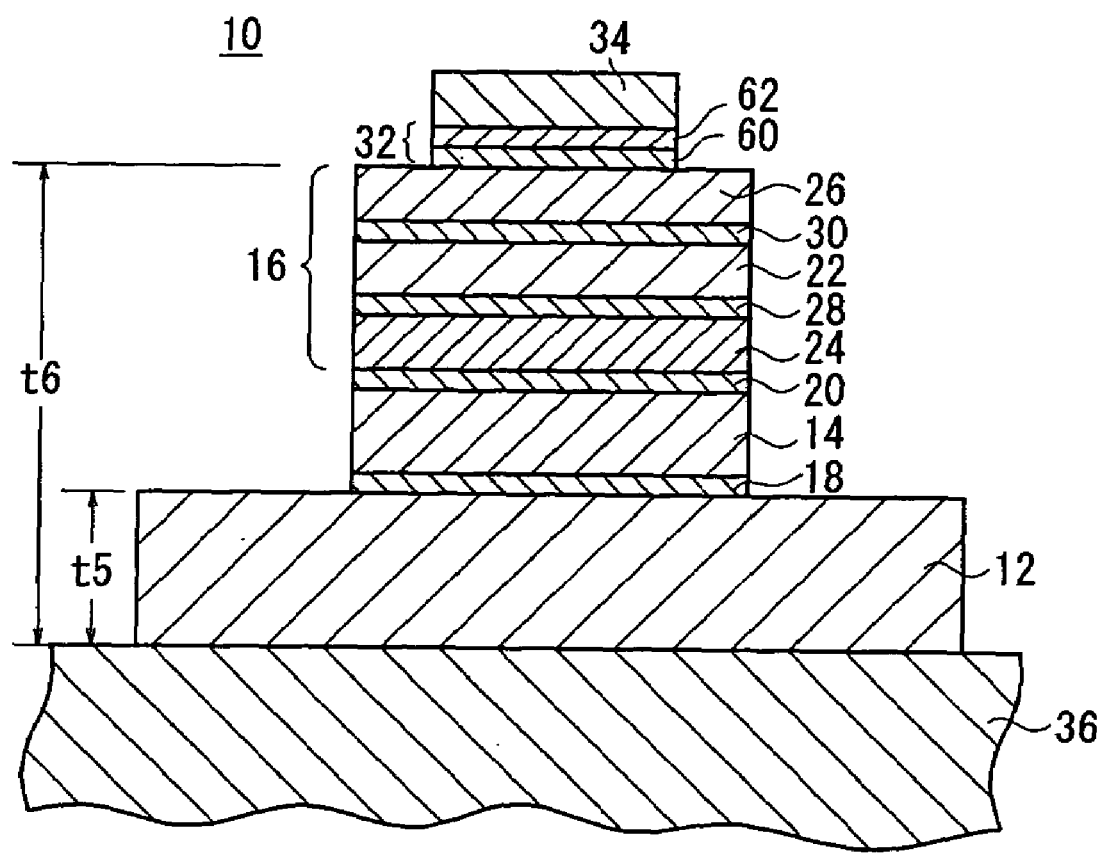
FIG. 1 shows a vertical sectional view illustrating a structure of a heat spreader module according to an embodiment of the present invention.

As shown in FIG. 1, a heat spreader module 10 according to an embodiment of the present invention comprises a base 12, a heat spreader member 14 which is arranged on the base 12, a thermal conductive layer 16 which is arranged on the heat spreader member 14, a first joining member 18 which is allowed to intervene between the base 12 and the heat spreader member 14, and a second joining member 20 which is allowed to intervene between the heat spreader member 14 and the thermal conductive layer 16.

The thermal conductive layer 16 includes an insulating substrate 22, an intermediate layer 24 which is allowed to intervene between the insulating substrate 22 and the heat spreader member 14, a circuit board 26 which is arranged on the insulating substrate 22 and which is composed of Cu or Al, a third joining member 28 which is allowed to intervene between the intermediate layer 24 and the insulating substrate 22, and a fourth joining member 30 which is allowed to intervene between the insulating substrate 22 and the circuit board 26.

An IC chip 34 is mounted on the circuit board 26 with an underlayer 32 intervening therebetween. A heat sink 36 which serves as a heat-releasing member composed of, for example, Al or Cu, is fixed to the lower surface of the base 12, for example, by means of the fastening with screws (not shown). AlN or $Si_3N_4$ can be used for the insulating substrate 22.

It is preferable that the coefficient of thermal conductivity of the heat spreader member 14 is not less than 150 W/mK, for the following reason. That is, if the coefficient of thermal conductivity is less than 150 W/mK, the heat, which is generated by the IC chip 34 as the heat spreader module 10 is used, is transmitted to the outside of the heat spreader module 10 at a slow speed. Therefore, a poor effect is obtained to retain a constant temperature of the heat spreader module 10.

The constitutive material for the heat spreader member 14 is not specifically limited provided that the coefficient of thermal conductivity and the coefficient of thermal expansion are within the ranges as described above. However, preferred examples may include at least one selected from the group consisting of SiC, AlN, $Si_3N_4$, BeO, $Al_2O_3$, $Be_2C$, C, Cu, Cu alloy, Al, Al alloy, Ag, Ag alloy, and Si. That is, the heat spreader member 14 can be composed of a composite material comprising a single substance or two or more substances selected from them. The composite material may be exemplified, for example, by an SiC/Cu composite material 40 (see FIG. 2) and a C/Cu composite material 42 (see FIG. 3).

Figure 2:
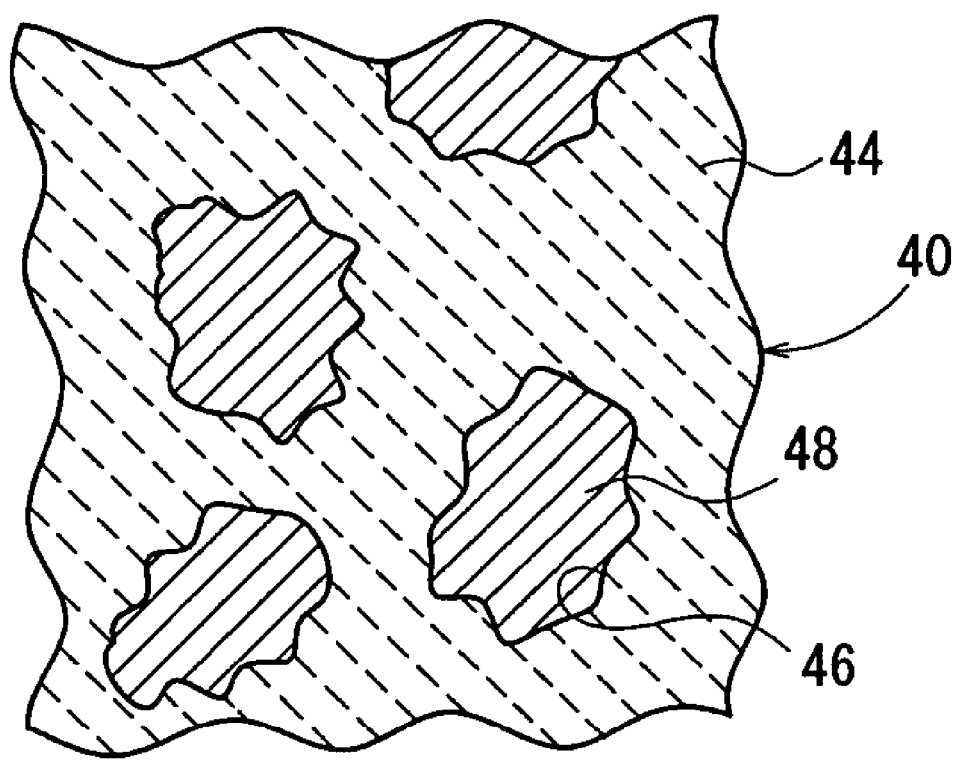
FIG. 2 shows a magnified view illustrating an SiC/Cu composite material as an example of the constitutive material for a heat spreader member.

As shown in FIG. 2, the SiC/Cu composite material 40 is obtained by impregnating open pores 46 of a porous sintered body 44 composed of SiC with Cu or Cu alloy 48, and then solidifying Cu or Cu alloy 48.

Figure 3:
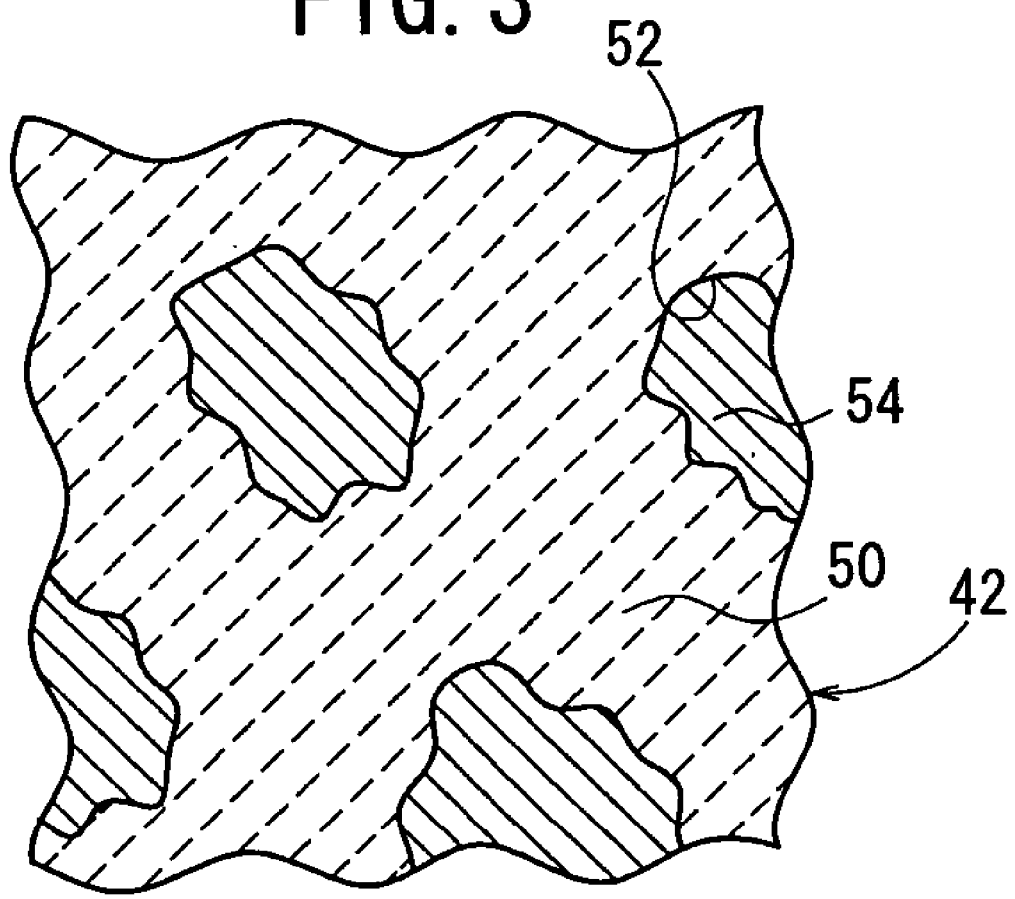
FIG. 3 shows a magnified view illustrating a C/Cu composite material as another example of the constitutive material for a heat spreader member.

As shown in FIG. 3, the C/Cu composite material 42 is obtained by impregnating open pores 52 of a porous sintered body 50 with melted Cu or Cu alloy 54, and then solidifying Cu or Cu alloy 54, wherein the porous sintered body 50 is obtained by preliminarily sintering carbon or allotrope thereof to form a network. The C/Cu composite material 42 is exemplified, for example, by a member described in Japanese Laid-Open Patent Publication No. 2001-339022.

When the heat spreader member 14 is composed of the composite material or the alloy as described above, the coefficient of thermal expansion and the coefficient of thermal conductivity can be controlled by setting the composition ratios of the constitutive components so that the coefficient of thermal expansion is $3.0 \times 10^{-6}$ to $1.0 \times 10^{-5}$/K and the coefficient of thermal conductivity is not less than 150 W/mK.

It is preferable that each of the first to fourth joining members 18, 20, 28, 30 is a hard solder material containing an active element. In this case, the active element include at least one of elements belonging to Group 2A in the periodic table such as Mg, Sr, Ca, Ba, and Be, Group 3A such as Ce, Group 4A such as Ti and Zr, Group 5A such as Nb, and Group 4B such as B and Si. In this embodiment, a hard solder material of Ag—Cu—Ti or a hard solder material of Ag—Cu—In—Ti was used as the first to fourth joining members 18, 20, 28, 30. In this case, the active element is Ti.

On the other hand, as shown in FIG. 1, the underlayer 32 comprises a solder layer 60 which is formed on the thermal conductive layer 16, and an Ni layer 62 which improves the wettability of the IC chip 34 with respect to the solder layer 60.

In the heat spreader module 10 according to this embodiment, the base 12 is composed of a copper alloy which has a proof stress of not less than 45 MPa and a coefficient of thermal conductivity of not less than 270 W/mK after performing a heat treatment between 600 and 900° C. for 10 minutes.

The copper alloy for constructing the base is, preferably any one of:

(a) a copper alloy comprising 0.1 to 1.5 mass % Cr and the balance being Cu;

(b) a copper alloy comprising 0.1 to 0.5 mass % Zr and the balance being Cu;

(c) a copper alloy comprising 0.05 to 0.3 mass % Zr, 0.3 to 1.2 mass % Cr, and the balance being Cu;

(d) a copper alloy comprising 0.01 to 1.5 mass % Ag and the balance being Cu;

(e) a copper alloy comprising 1.4 to 3.0 mass % Fe, 0.05 to 0.2 mass % Zn, 0.01 to 0.1 mass % P, and the balance being Cu; and (f) alumina-dispersed copper.

It is preferable that the thickness t5 of the base 12 is not less than 0.5 mm, and the thickness t5 is not more than 40% of the entire thickness t6 of the heat spreader module 10.

An exemplary experiment will now be described. This exemplary experiment resides in an observation about the proof stress of the base 12, the coefficient of thermal conductivity of the heat spreader module 10, and the deformation ratio during the handling after performing the joining under the following joining condition for Comparative Examples 1 to 3 and Examples 1 to 10.

The joining condition was as follows. That is, Ag-27Cu-13In-1.3Ti was used as the first to fourth joining members 18, 20, 28, 30, the joining temperature was 830° C., and the treatment time was 10 minutes.

Details of Comparative Examples 1 to 3 and Examples 1 to 10 are shown in FIG. 4 together with results of the measurement. In FIG. 4, t1 represents the thickness of the circuit board 26, t2 represents the thickness of the insulating substrate 22, t3 represents the thickness of the intermediate layer 24, and t4 represents the thickness of the heat spreader member 14.

The deformation ratio in the handling indicates the ratio of the appearance of deformation deviated from the standard size as observed after each of the heat spreader modules 10 constructed in accordance with Comparative Examples 1 to 3 and Examples 1 to 10 was fastened with bolts to a heat sink member made of Al to perform the evaluation.

In FIG. 4, t5 represents the thickness of the base 12, t6 represents the entire thickness of the heat spreader module 10, and t5/t6 represents the ratio of the thickness t5 of the base 12 with respect to the entire thickness t6 of the heat spreader module 10.

In FIG. 4, λb represents the coefficient of thermal conductivity of the base 12 after the joining, YS represents the proof stress of the base 12 after the joining, and λm represents the coefficient of thermal conductivity of the joined heat spreader module 10.

The following measuring methods were adopted. That is, the joined unit was actually measured for the coefficient of thermal conductivity of the base 12 itself after the joining and the coefficient of thermal conductivity of the entire heat spreader module 10. However, the proof stress YS of the base 12 after the joining was based on the use of a measured value obtained for a test sample which belonged to the same production lot and which was made of the same materials applied with the same heat history by placing the test sample in the same joining furnace as that used for the heat spreader module 10 to be joined.

The following materials were used for all of Comparative Examples 1 to 3 and Examples 1 to 10. That is, a pure copper plate having a thickness of 0.3 mm was used as the circuit board 26, an SN substrate having a thickness of 0.3 mm was used as the insulating substrate 22, a pure copper plate having a thickness of 0.3 mm was used as the intermediate layer 24, and a C/Cu composite material having a thickness of 3 mm was used as the heat spreader member 14.

In Comparative Example 1, a pure copper plate having a thickness of 1 mm was used as the base 12. In Comparative Example 2, a pure copper plate having a thickness of 2 mm was used as the base 12. In Comparative Example 3, a copper alloy having a thickness of 2 mm comprising 2.2 mass % Sn and the balance being Cu was used as the copper alloy for constructing the base 12.

In Examples 1 to 4, a copper alloy comprising 0.8 mass % Cr and the balance being Cu was used as the copper alloy of the base 12 respectively. The thickness t5 of the base 12 was 0.5 mm in Example 1 (t6=5.1 mm, (t5/t6)×100=9.8%), 1 mm in Example 2 (t6=5.6 mm, (t5/t6)×100=17.9%), 2 mm in Example 3 (t6=6.6 mm, (t5/t6)×100=30.3%), and 3 mm in Example 4 (t6=7.6 mm, (t5/t6)×100=39.5%).

In Examples 5 and 6, a copper alloy comprising 1.0 mass % Cr, 0.2 mass % Zr, and the balance being Cu was used as the copper alloy of the base 12 respectively. The thickness t5 of the base 12 was 1 mm in Example 5 (t6=5.6 mm, (t5/t6)×100=17.9%) and 2 mm in Example 6 (t6=6.6 mm, (t5/t6)×100=30.3%).

In Examples 7 and 8, a copper alloy comprising 0.25 mass % Zr and the balance being Cu was used as the copper alloy of the base 12 respectively. The thickness t5 of the base 12 was 1 mm in Example 7 (t6=5.6 mm, (t5/t6)×100=17.9%) and 2 mm in Example 8 (t6=6.6 mm, (t5/t6)×100=30.3%).

In Example 9, a copper alloy comprising 0.7 mass % Ag and the balance being Cu was used as the copper alloy of the base 12. The thickness t5 of the base 12 was 2 mm (t6=6.6 mm, (t5/t6)×100=30.3%).

In Example 10, a copper alloy comprising 2.3 mass % Fe, 0.12 mass % Zn, 0.03 mass % P, and the balance being Cu was used as the copper alloy of the base 12. The thickness t5 of the base 12 was 2 mm (t6=6.6 mm, (t5/t6)×100=30.3%).

As shown in the results of the measurement in FIG. 4, in Comparative Examples 1 and 2, the base was deformed in the handling, because the proof stress after the joining was low, i.e., 14 MPa. On the other hand, in Examples 1 to 10, no trouble arises in the handling to be performed thereafter, because the proof stress after the joining is high, i.e., not less than 45. Further, the following fact is appreciated in relation to any one of Examples 1 to 10. That is, the coefficient of thermal conductivity of the heat spreader module 10 is not less than 280 W/mK. The deterioration of the thermal conductivity characteristic is suppressed to be less than 10% as compared with the case in which the pure copper is used for the base. The coefficient of thermal conductivity is scarcely lowered when those having appropriate coefficients of thermal conductivity are used as the copper alloy.

In Comparative Example 3, the deformation is not caused in the base during the handling, because the proof stress after the joining is high, i.e., 165 MPa. However, the coefficient of thermal conductivity of the base is low, i.e., 225 W/mK. Therefore, Comparative Example 3 is not desirable, because the coefficient of thermal conductivity of the heat spreader module 10 is 251 W/mK, which results in the deterioration of the thermal conductivity characteristic by not less than 10% as compared with the case in which the pure copper is.

Next, an explanation will be made with reference to FIGS. 5A and 5B about a method for producing the heat spreader module 10 according to the embodiment of the present invention.

Figure 5A:
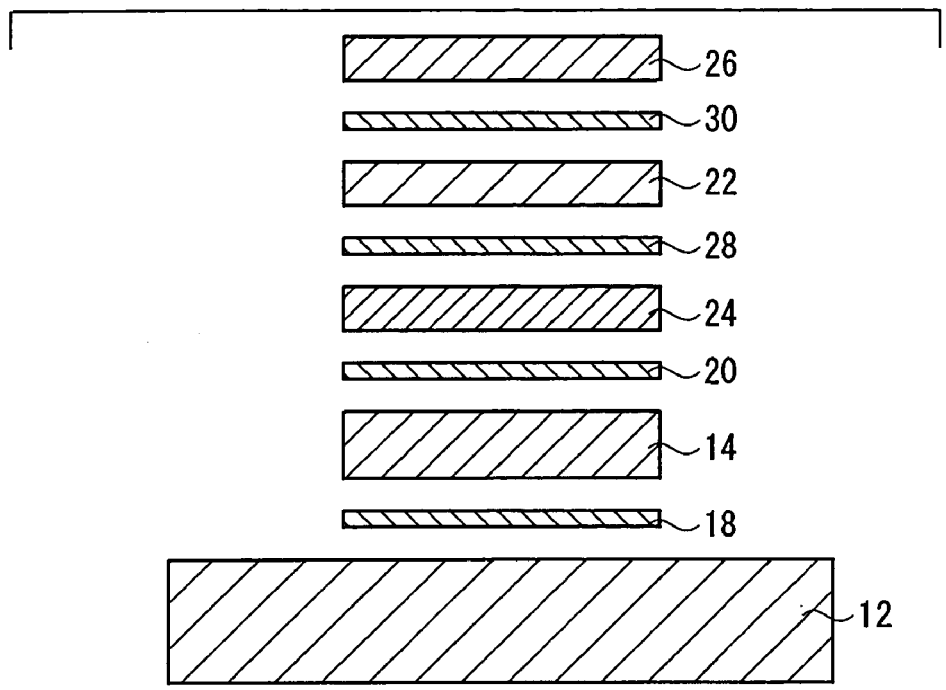
FIG. 5A illustrates a setting step.

First, in a setting step shown in FIG. 5A, the first joining member 18, the heat spreader member 14, the second joining member 20, the intermediate layer 24, the third joining member 28, the insulating substrate 22, the fourth joining member 30, and the circuit board 26 are placed (subjected to the setting) in this order on the base 12. The setting step is performed, for example, in the atmospheric air.

Subsequently, in a joining step shown in FIG. 5B, the base 12, on which the first joining member 18, the heat spreader member 14, the second joining member 20, the intermediate layer 24, the third joining member 28, the insulating substrate 22, the fourth joining member 30, and the circuit board 26 have been set, is fixed on a jig 70. The temperature is raised and lowered to effect the joining while applying the pressure in the downward direction, for example, in a vacuum atmosphere of $1.0 \times 10^{-5}$ Torr or low. As a result of the joining treatment, the joined unit, i.e., the heat spreader module 10, in which the circuit board 26, the insulating substrate 22, the intermediate layer 24, the heat spreader member 14, and the base 12 are integrated into one unit as shown in FIG. 1, is obtained.

In the joining step, it is preferable that the pressure is applied with a force of not less than 0.2 MPa and not more than 10 MPa. In this procedure, the average thicknesses of the first to fourth joining members 18, 20, 28, 30 after the joining are not more than 50 μm, desirably not more than 10 μm, and more desirably not more than 5 μm. The thicknesses can be controlled in accordance with the application of the pressure as described above.

Figure 5B:
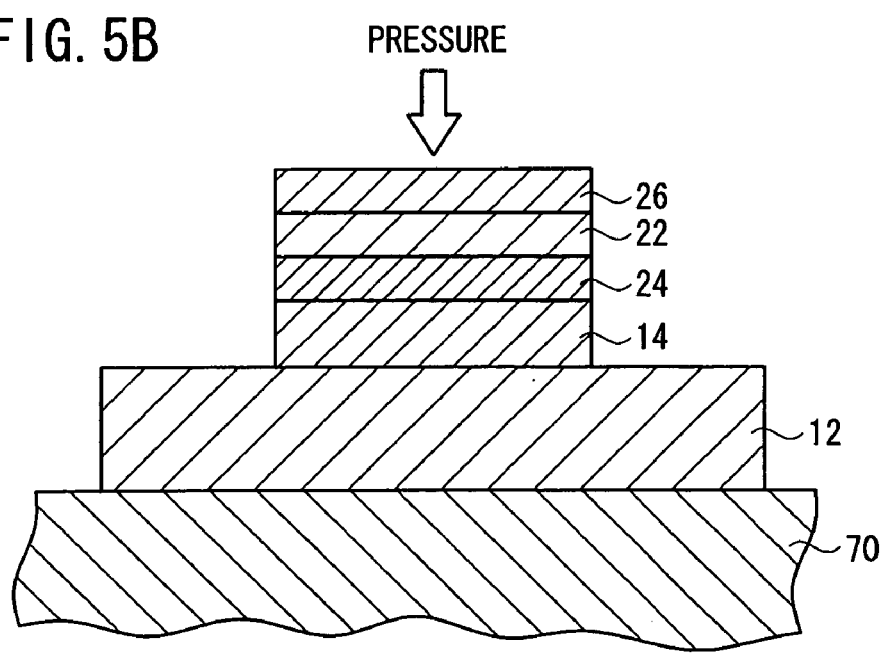
FIG. 5B illustrates a joining step.

As described above, in the heat spreader module 10 according to the embodiment of the present invention, the base 12 is not excessively softened, and no deformation is caused during the handling to be performed thereafter even when the heat treatment is performed for 10 minutes at the temperature of 600° to 900° C. which is not less than the melting point of the hard solder material when the heat spreader module 10 is completed by means of the one-time joining as shown in FIGS. 5A and 5B by using the hard solder material as the first to fourth joining members 18, 20, 28, 30 respectively.

That is, in the embodiment of the present invention, even when the joining method, which makes it possible to effectively reduce the production cost to be inexpensive, is used, the base 12 is not deformed, for example, during the handling to be performed thereafter. Further, the embodiment of the present invention scarcely undergoes the decrease in coefficient of thermal conductivity of the heat spreader module 10 which would be otherwise caused as a harmful influence in order to secure the proof stress value.

In other words, it is possible to maintain the strength of the base 12 while the coefficient of thermal conductivity required for the heat spreader module 10 is scarcely lowered. It is possible to reduce the production cost of the heat spreader module 10 to be inexpensive, realize the easy handling, and improve the reliability.

It is a matter of course that the heat spreader module according to the present invention is not limited to the embodiment described above, which may be embodied in other various forms without deviating from the gist or essential characteristics of the present invention.

As explained above, according to the heat spreader module concerning the present invention, it is possible to suppress the deformation during the handling, because the proof stress value of the base is successfully maintained to be not less than the certain value after the joining as well even when the hard solder material is used as the joining material. Further, the coefficient of thermal conductivity is not lowered.

What is claimed is:

1. A heat spreader module, comprising:
   a base;
   a heat spreader member joined on said base, said heat spreader member comprising a composite material including carbon and one of copper and a copper alloy; and
   an insulating substrate arranged on said heat spreader member,
   wherein said base, said heat spreader member, and said insulating substrate are joined with a hard solder material having a melting point of not less than 600° C.,
   wherein said base includes a copper alloy which has a proof stress of not less than 45 MPa and a coefficient of thermal conductivity of not less than 270 W/mK when subjected to a heat treatment between 600° and 900° C. for 10 minutes, and
   wherein the copper alloy of said base is any one of:
   (a) a copper alloy comprising 0.1 to 1.5 mass % Cr and the balance being Cu;
   (b) a copper alloy comprising 0.1 to 0.5 mass % Zr and the balance being Cu;
   (c) a copper alloy comprising 0.05 to 0.3 mass % Zr, 0.3 to 1.2 mass % Cr, and the balance being Cu;
   (d) a copper alloy comprising 0.01 to 1.5 mass % Ag and the balance being Cu;
   (e) a copper alloy comprising 1.4 to 3.0 mass % Fe, 0.05 to 0.2 mass % Zn, 0.01 to 0.1 mass % P, and the balance being Cu; and
   (f) alumina-dispersed copper.

2. The heat spreader module according to claim 1, wherein said composite material comprises a C base material impregnated with copper or a copper alloy.

3. The heat spreader module according to claim 1, wherein said insulating substrate includes one of AlN and $Si_3N_4$.

4. The heat spreader module according to claim 1, wherein said base has a thickness of not less than 0.5 mm, and said thickness is not more than 40% of an entire thickness of said heat spreader module.

5. The heat spreader module according to claim 1, wherein an IC chip is arranged on said insulating substrate with an electrode interposed between said IC chip and said insulating substrate.

6. The heat spreader module according to claim 1, wherein a heat-releasing member is joined under said heat spreader member.

7. A heat spreader module, comprising:
   a base;
   a heat spreader member joined on said base, said heat spreader member comprising a composite material including SiC and one of copper and a copper alloy; and
   an insulating substrate arranged on said heat spreader member,
   wherein said base, said heat spreader member, and said insulating substrate are joined with a hard solder material having a melting point of not less than 600° C.,
   wherein said base includes a copper alloy which has a proof stress of not less than 45 MPa and a coefficient of thermal conductivity of not less than 270 W/mK when subjected to a heat treatment between 600° and 900° C. for 10 minutes, and
   wherein the copper alloy of said base is any one of:
   (a) a copper alloy comprising 0.1 to 1.5 mass % Cr and the balance being Cu;

(b) a copper alloy comprising 0.1 to 0.5 mass % Zr and the balance being Cu;

(c) a copper alloy comprising 0.05 to 0.3 mass % Zr, 0.3 to 1.2 mass % Cr, and the balance being Cu;

(d) a copper alloy comprising 0.01 to 1.5 mass % Ag and the balance being Cu;

(e) a copper alloy comprising 1.4 to 3.0 mass % Fe, 0.05 to 0.2 mass % Zn, 0.01 to 0.1 mass % P, and the balance being Cu; and (f) alumina-dispersed copper.

8. The heat spreader module according to claim 7, wherein said composite material comprises an SiC base material impregnated with copper or a copper alloy.

9. The heat spreader module according to claim 7, wherein said insulating substrate includes one of AlN and $Si_3N_4$.

10. The heat spreader module according to claim 7, wherein said base has a thickness of not less than 0.5 mm, and said thickness is not more than 40% of an entire thickness of said heat spreader module.

11. The heat spreader module according to claim 7, wherein an IC chip is arranged on said insulating substrate with an electrode interposed between said IC chip and said insulating substrate.

12. The heat spreader module according to claim 7, wherein a heat-releasing member is joined under said heat spreader member.

* * * * *